(12) United States Patent
Kawata

(10) Patent No.: US 9,786,686 B2
(45) Date of Patent: Oct. 10, 2017

(54) DISPLAY DEVICE

(71) Applicant: Japan Display Inc., Minato-ku (JP)

(72) Inventor: Yasushi Kawata, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 14/930,999

(22) Filed: Nov. 3, 2015

(65) Prior Publication Data

US 2016/0124259 A1 May 5, 2016

(30) Foreign Application Priority Data

Nov. 4, 2014 (JP) ................................ 2014-224232
Jul. 28, 2015 (JP) ................................ 2015-148332

(51) Int. Cl.
*G02F 1/1345* (2006.01)
*H01L 27/12* (2006.01)

(52) U.S. Cl.
CPC ...... *H01L 27/1218* (2013.01); *G02F 1/13452* (2013.01); *G02F 1/13458* (2013.01); *H01L 27/124* (2013.01)

(58) Field of Classification Search
CPC ............. H01L 27/1214; H01L 27/3262; H01L 27/3276; H01L 27/12; H01L 27/3244; H01L 29/41733; H01L 29/4908; H01L 21/02107; H01L 2924/14; H01L 51/0097; G02F 1/1333; G02F 1/1343; G02F 1/1368; G02F 1/13452; G02F 1/134309; G02F 1/13458; G02F 1/133345; G02F 1/13454; G02F 1/1345; G02F 1/133305; G02F 1/1339; G02F 1/1362; G02F 2201/40; G02F 1/133553

USPC .......... 438/149, 151; 349/43, 153, 138, 158, 349/122, 139, 149, 150, 151, 152
See application file for complete search history.

(56) References Cited

U.S. PATENT DOCUMENTS

| | | | | |
|---|---|---|---|---|
| 5,668,700 | A | * 9/1997 | Tagusa | ................ H01L 23/5387 257/E21.516 |
| 7,259,813 | B2 | * 8/2007 | Oda | ................... G02F 1/133553 349/113 |
| 2012/0195024 | A1 | * 8/2012 | Kawaguchi | ............ H05K 3/363 362/97.2 |
| 2014/0361183 | A1 | 12/2014 | Takeda et al. | |
| 2015/0327368 | A1 | * 11/2015 | Su | ......................... H05K 1/118 174/254 |

FOREIGN PATENT DOCUMENTS

| | | |
|---|---|---|
| JP | 10-104651 | 4/1998 |
| JP | 10-189863 | 7/1998 |
| JP | 2009-237410 | 10/2009 |
| JP | 2014-236209 | 12/2014 |

* cited by examiner

*Primary Examiner* — Thoi Duong
(74) *Attorney, Agent, or Firm* — Oblon, McClelland, Maier & Neustadt, L.L.P.

(57) ABSTRACT

According to one embodiment, a display device includes a first substrate includes an insulating substrate including a pierced portion, a pad electrode formed on the insulating substrate, and a signal line electrically connected to the pad electrode, a wiring board includes an interconnecting wiring and located under the insulating substrate, and a conductive material provided in the pierced portion and electrically connecting the pad electrode and the interconnecting wiring to each other.

13 Claims, 15 Drawing Sheets

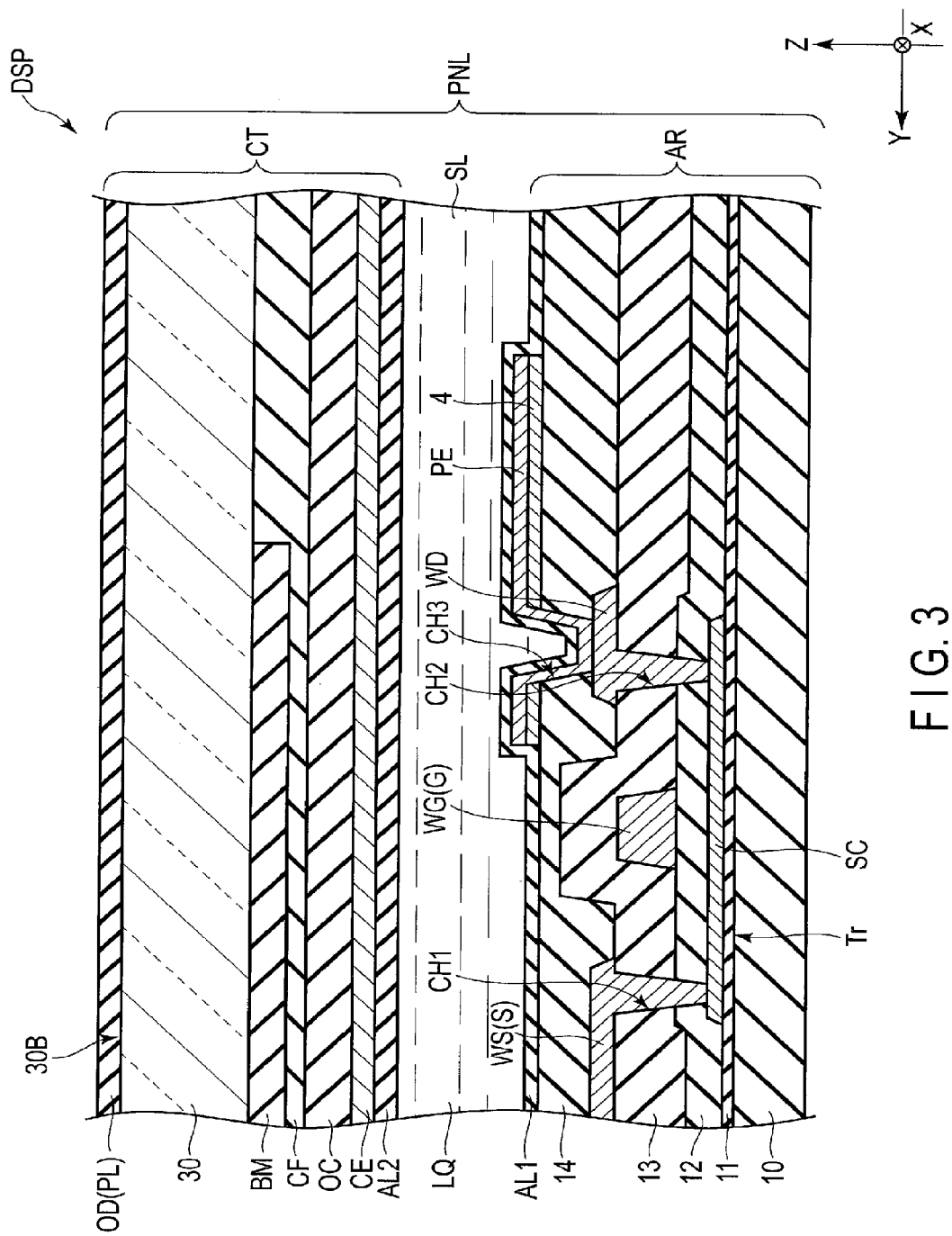
F I G. 3

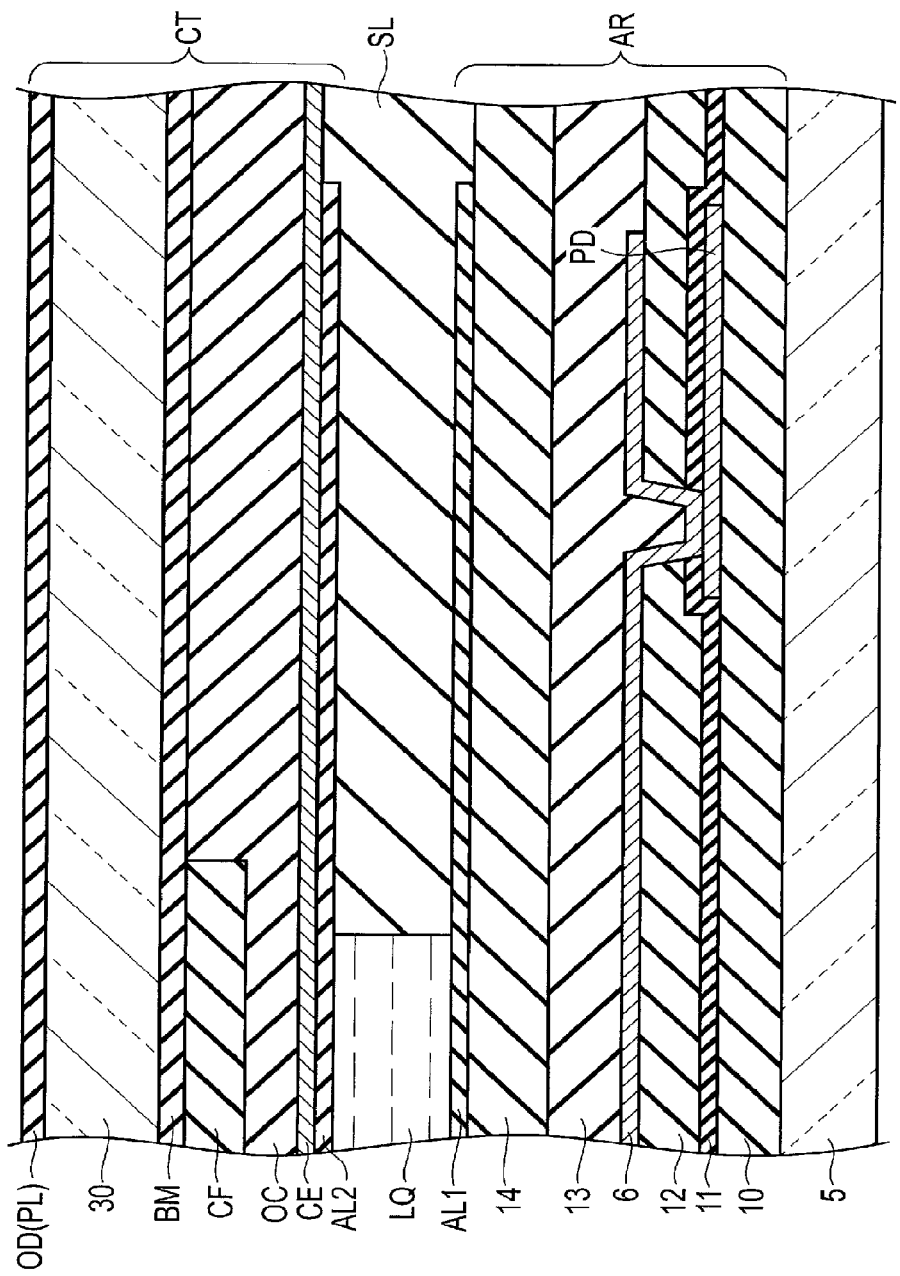
F I G. 5

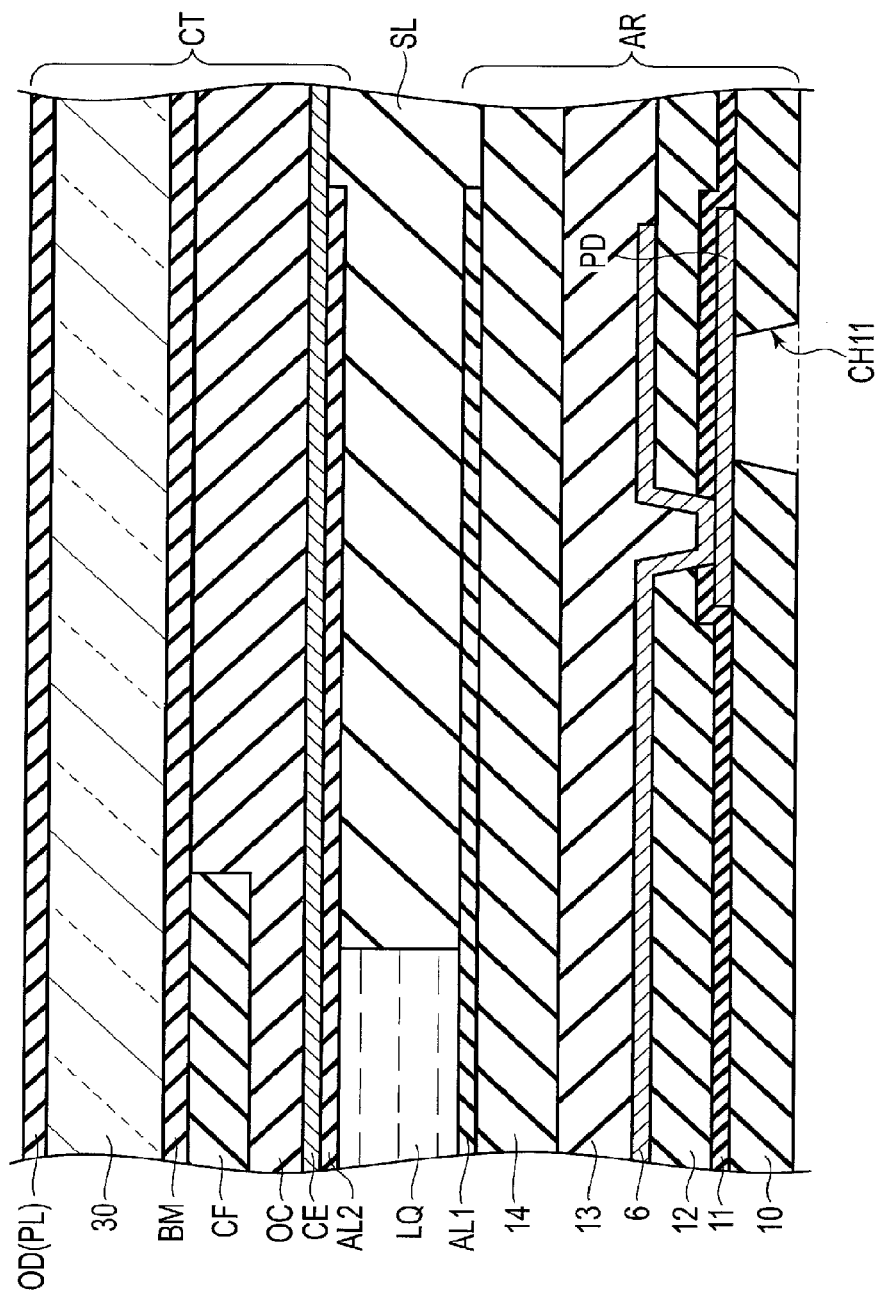
F I G. 6

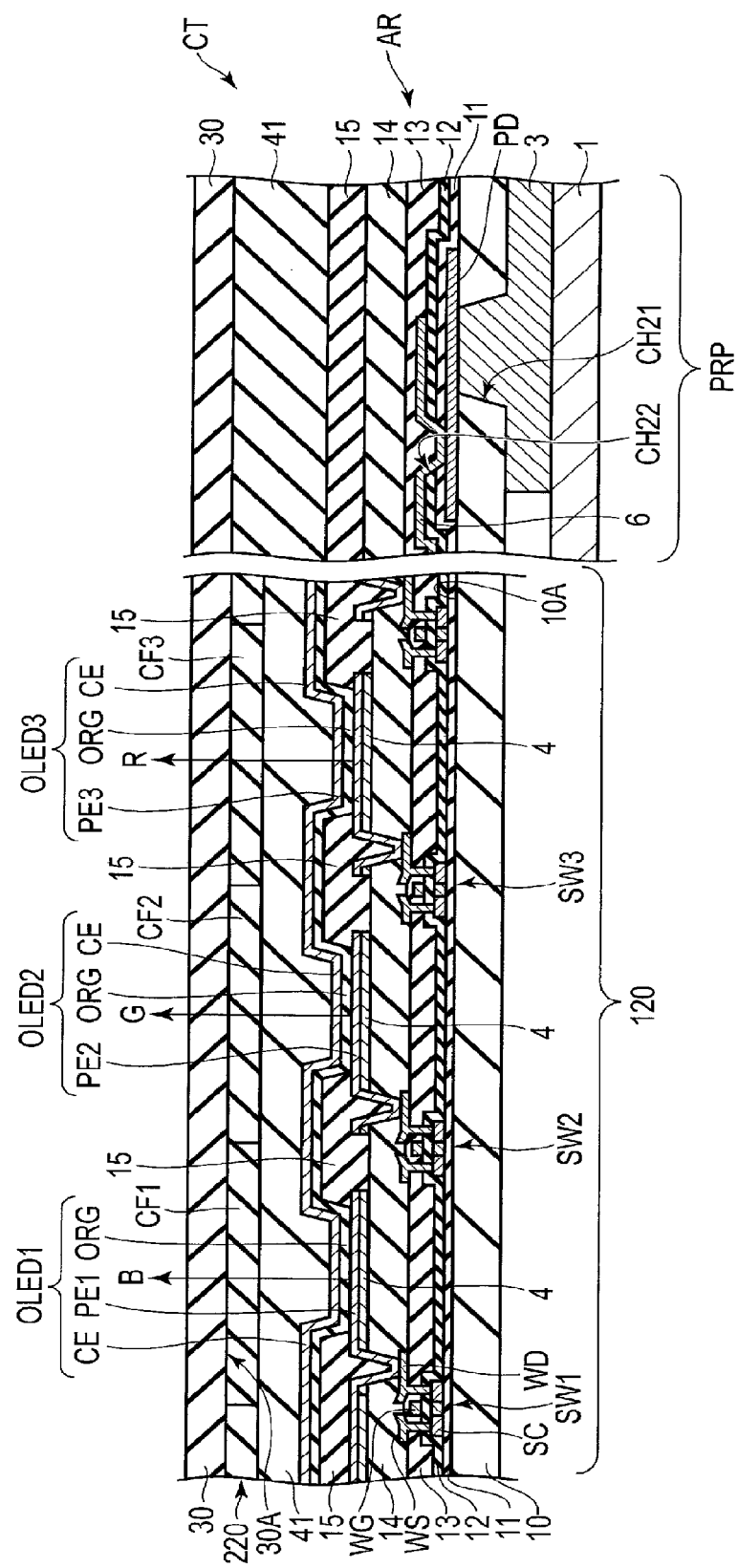
F I G. 8

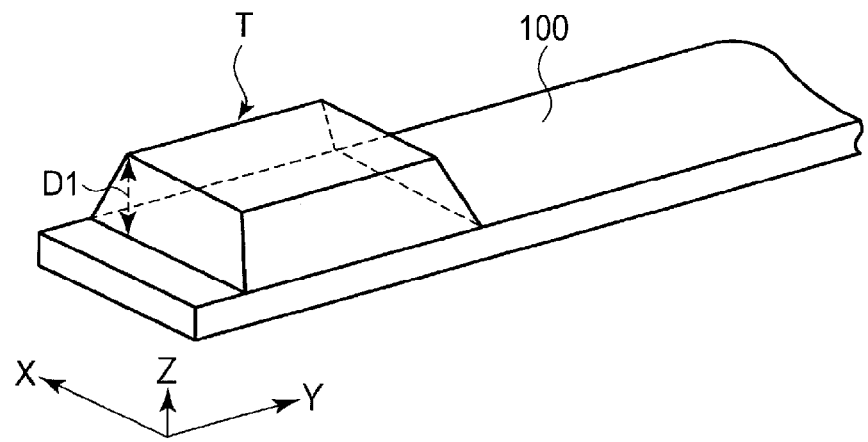
F I G. 11
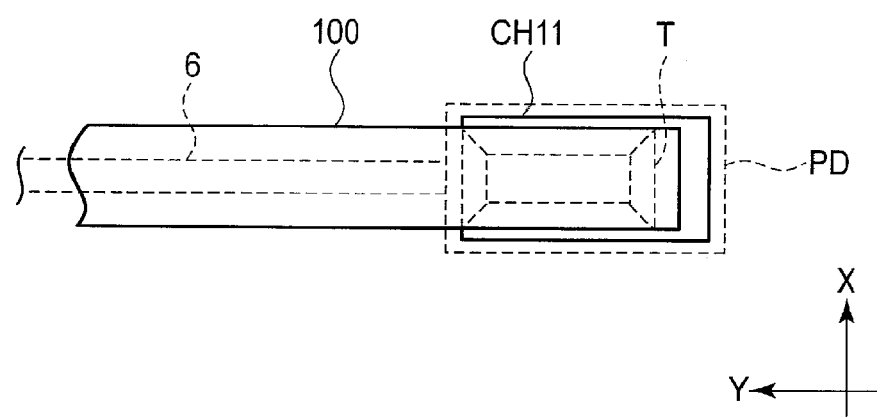
F I G. 12

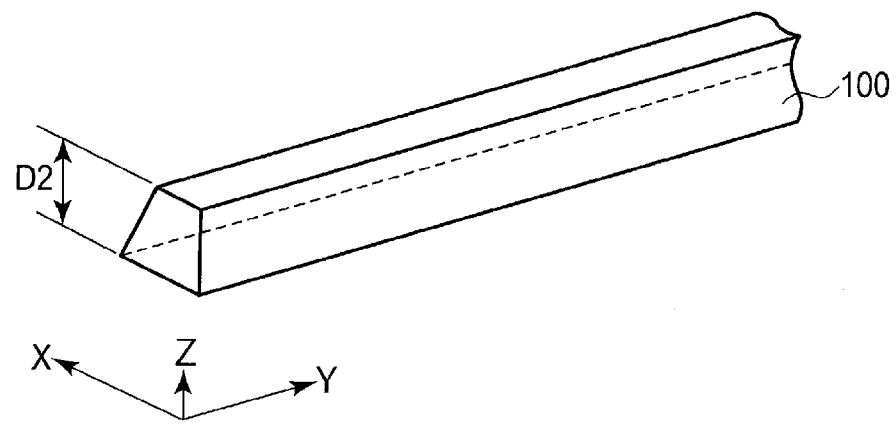
F I G. 14
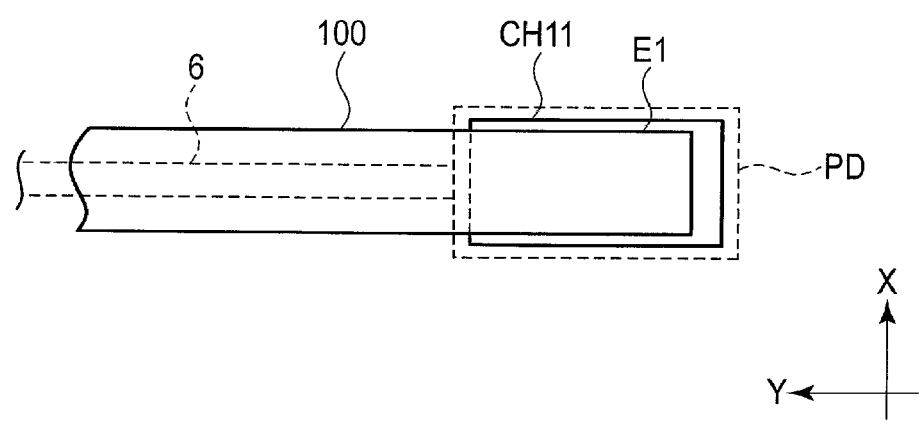
F I G. 15

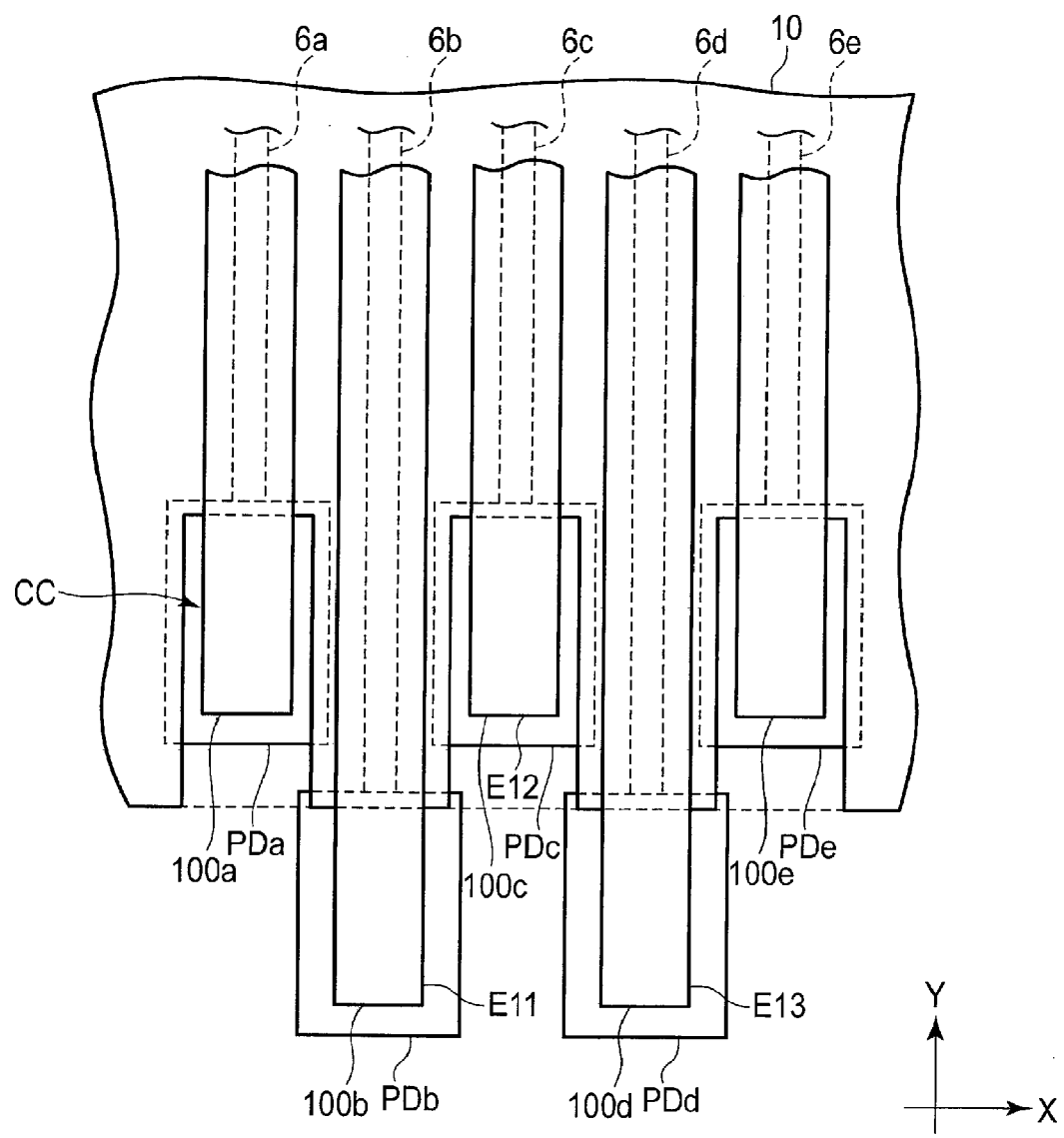
F I G. 19

DISPLAY DEVICE

CROSS-REFERENCE TO RELATED APPLICATIONS

This application is based upon and claims the benefit of priority from Japanese Patent Applications No. 2014-224232, filed Nov. 4, 2014; and No. 2015-148332, filed Jul. 28, 2015, the entire contents of all of which are incorporated herein by reference.

FIELD

Embodiments described herein relate generally to a display device.

BACKGROUND

In recent years, there has been an increasing demand in the field of mobile data terminal devices such as cellular phones and personal digital assistants (PDAs) for a display device with a larger display area occupying a display surface in area ratio in terms of performance and design, etc. For example, there have been proposed display devices which realize a further narrow frame.

Conventionally, the structure where a driver is mounted on a periphery of a display area of a substrate containing electrodes has been known. In a display device with a mount system on which such a driver is mounted, a flexible printed circuit board (FPC) is used as a wiring board for inputting an input signal and voltage to the driver. In order to achieve an improvement in the yield and narrowing of the frame, there have been studies to develop a method of electrically connecting an interconnect formed on a lower surface side of an array substrate with a driver formed on an upper surface side thereof via a contact hole made through the array substrate without using an FPC or the like.

BRIEF DESCRIPTION OF THE DRAWINGS

FIG. 3 is a sectional view of the display device DSP shown in FIG. 1 taken along its active area ACT.

FIG. 5 is a schematic sectional view for illustrating the first step of fixing an array substrate AR formed on a support substrate 5 and a counter substrate CT.

FIG. 6 is a schematic sectional view for illustrating the second step, which follows the first step of FIG. 5, of forming a contact hole CH11 in the array substrate AR.

FIG. 8 is a schematic sectional view showing a modified example of the display device DSP according to this embodiment.

FIG. 11 is a perspective view showing the structure of a part of an interconnecting wiring 100 shown in FIG. 10.

FIG. 12 is a diagram illustrating positions of the interconnecting wiring 100, the contact hole CH11, a pad electrode PD and the like with respect to each other in the display device DSP shown in FIG. 10.

FIG. 14 is a perspective view showing the structure of a part of the interconnecting wiring 100 shown in FIG. 13.

FIG. 15 is a diagram illustrating positions of the interconnecting wiring 100, the contact hole CH11, the pad electrode PD and the like with respect to each other in the display device DSP shown in FIG. 13.

FIG. 19 is a diagram showing an example of the layout of the structure of the modified example shown in FIG. 17.

DETAILED DESCRIPTION

In general, according to one embodiment, a display device comprising: a first substrate comprising an insulating substrate including a pierced portion, a pad electrode formed on the insulating substrate, and a signal line electrically connected to the pad electrode; a wiring board comprising an interconnecting wiring and located under the insulating substrate; and a conductive material provided in the pierced portion and electrically connecting the pad electrode and the interconnecting wiring to each other.

Embodiments will now be described with reference to accompanying drawings. Note that the disclosure is presented for the sake of exemplification, and any modification and variation conceived within the scope and spirit of the invention by a person having ordinary skill in the art are naturally encompassed in the scope of invention of the present application. Furthermore, a width, thickness, shape, and the like of each element are depicted schematically in the figures as compared to actual embodiments for the sake of simpler explanation, and they do not limit the interpretation of the invention of the present application. Furthermore, in the description and figures of the present application, structural elements having the same or similar functions will be referred to by the same reference numbers and detailed explanations of them that are considered redundant may be omitted.

Figure 1:
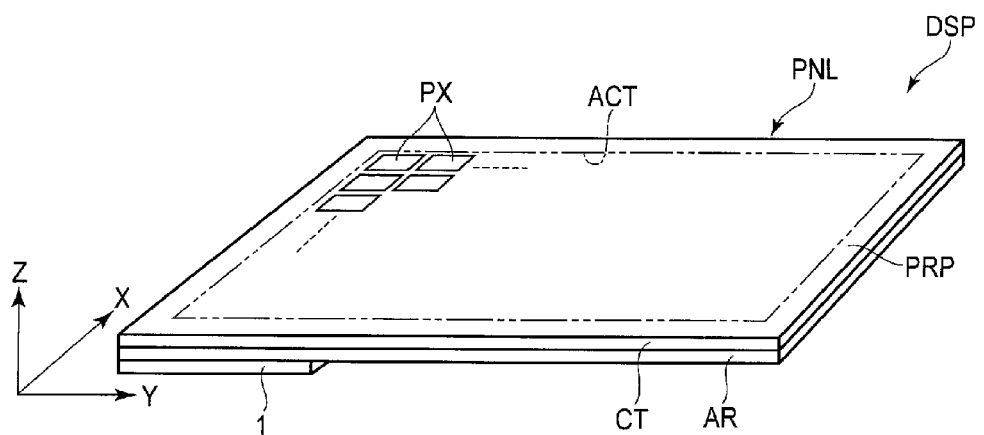
FIG. 1 is a perspective view briefly showing the structure of a display device DSP according to this embodiment.

First, a display device according to this embodiment will be described in detail. FIG. 1 is a perspective view briefly showing the structure of a display device DSP according to this embodiment. FIG. 1 shows a three-dimensional space defined by a first direction X, a second direction Y perpendicular to the first direction X, and a third direction Z perpendicular to the first direction X and the second direction Y. Note that this embodiment will be described in connection with an example case where the display device is a liquid crystal display.

As shown in FIG. 1, a display device DSP comprises an active-matrix-type liquid crystal display panel PNL and a wiring board 1. The liquid crystal display panel PNL comprises a planar array substrate AR, a planer counter substrate CT opposing the array substrate AR and a liquid crystal layer (liquid crystal layer LQ, which will be described later) interposed between the array substrate AR and the counter substrate CT. Note that in this embodiment, the array substrate AR is equivalent to a first substrate and the counter substrate CT is equivalent to a second substrate. The liquid crystal display panel PNL of this embodiment is a reflective type liquid crystal display panel.

In this embodiment, the positive direction of the third direction Z or the direction toward the counter substrate CT from the array substrate AR side is defined as top or upward, and the negative direction of the third direction Z or the direction towards the array substrate AR from the counter substrate CT side is defined as bottom or downward.

The liquid crystal display panel PNL comprises an active area (display area) ACT configured to display images and a frame area (non-display area) PRP around the active area ACT. The liquid crystal display panel PNL comprises a plurality of pixels PX in the active area ACT. The pixels PX are arranged into a matrix along the first direction X and the second direction, crossing each other.

In an example, the length of a side (for example, a short side) of the array substrate AR, which is parallel to the first direction X is approximately equal to that of a side of the counter substrate CT, which is parallel to the first direction X. Further, the length of a side of the array substrate AR (for example, a long side), which is parallel to the second direction Y is approximately equal to that of a side of the counter substrate CT, which is parallel to the second direction Y. That is, the area of the array substrate AR taken parallel to the X-Y plane is approximately equal to that of the counter substrate CT, taken parallel to the X-Y plane. Further, each side of the array substrate AR opposes on each side of the counter substrate CT along the third direction Z.

The wiring board 1 is placed under the liquid crystal display panel PNL. In one example, the length of a side of the wiring board 1, which is parallel to the first direction X is shorter than or equal to those of the sides of the array substrate AR and the counter substrate CT, parallel to the first direction X. Further, the length of a side of the wiring board 1, which is parallel to the second direction Y is shorter than or equal to those of the sides of the array substrate AR and the counter substrate CT, parallel to the second direction Y. The wiring board 1 is disposed to overlap one edge of the liquid crystal display panel PNL to overlay the frame area PRP and the active area ACT. Note that the wiring board 1 never protrudes outside the position where it overlaps the liquid crystal display panel PNL. The liquid crystal display panel PNL and the wiring board 1 are electrically connected to each other.

Figure 2:
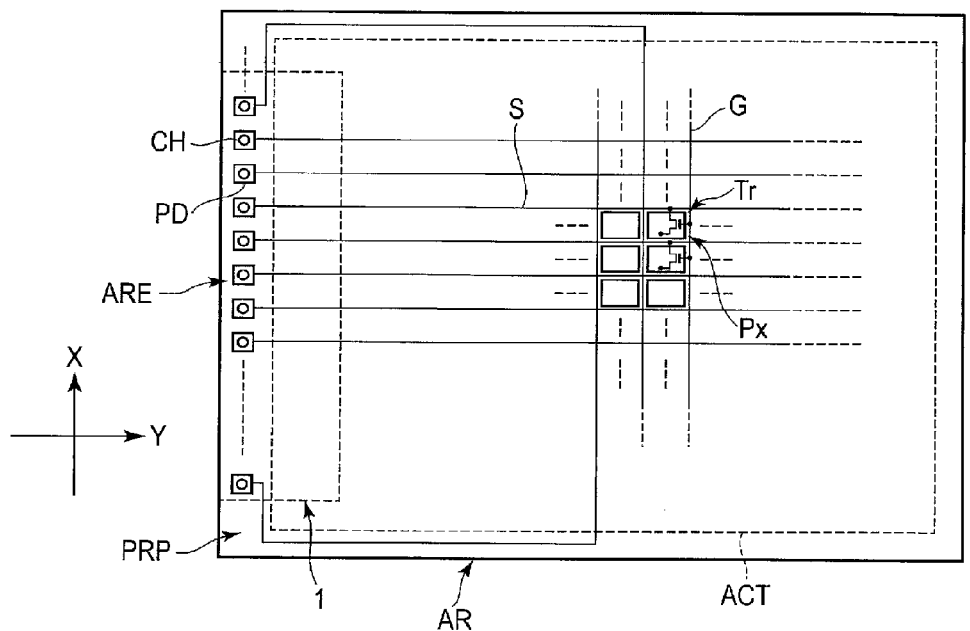
FIG. 2 is a schematic plan view showing an array substrate AR of the display device DSP shown in FIG. 1.

FIG. 2 is a schematic plan view showing the array substrate AR of the display device DSP shown in FIG. 1.

The array substrate AR comprises a plurality of gate lines G each extending along the first direction X and arranged along the second direction Y, and a plurality of source lines S extending along the second direction Y and arranged along the first direction X, a plurality of thin film transistors Tr each electrically connected to a respective gate line G and a respective source line S in each respective pixel PX, and the like in the active area ACT. Each pixel PX is defined as a partition by, for example, two adjacent source lines S and two adjacent gate lines G. Each thin film transistor Tr functions as a switching element.

A plurality of contact holes CH made through the array substrate AR and pad electrodes PD are formed in one end ARE of the array substrate AR in the frame area PRP. Each of the pad electrodes PD is formed at the position overlapping the respective contact hole CH. The source lines S and the gate lines G are led out to the frame area PRP and are electrically connected with the pad electrodes PD, respectively. The wiring board 1 is disposed to overlap the one end ARE of the array substrate AR, indicated by a dashed line in the figure. The wiring board 1 is electrically connected to the pad electrodes PD via a conductive material (not shown) through the contact holes CH, as described later.

FIG. 3 is a sectional view of the display device DSP shown in FIG. 1 taken along its active area ACT. Note that FIG. 3 shows a reflective type liquid crystal display device which uses a twisted nematic (TN) mode as an example.

As shown in FIG. 3, the array substrate AR comprises a first insulating substrate 10, a thin film transistor Tr, a reflective layer 4, a pixel electrode PE, a first alignment film AL1 and the like. The first insulating substrate 10 is formed from an organic insulating material, for example, polyimide. The first insulating substrate 10 is covered by a first insulating film 11.

The thin film transistor Tr is formed on the first insulating film 11. In the example illustrated, the thin film transistor Tr is configured as a top gate type, but it may be configured as a bottom gate type. The thin film transistor Tr comprises a semiconductor layer SC formed on the first insulating film 11. The semiconductor layer SC is covered by a second insulating film 12. Moreover, the second insulating film 12 is provided on the first insulating film 11.

A gate electrode WG of the thin film transistor Tr is formed on the second insulating film 12 and is located immediately above the semiconductor layer SC. The gate electrode WG is electrically connected to a gate line G (or formed integrally with a gate line G) and is covered by a third insulating film 13. Further, the third insulating film 13 is provided also on the second insulating film 12.

The first insulating film 11, the second insulating film 12 and the third insulating film 13 are each formed of an inorganic material such as a silicon oxide or a silicon nitride.

A source electrode WS and a drain electrode WD of the thin film transistor Tr are formed on the third insulating film 13. Similarly, the source line S is formed on the third insulating film 13. The source electrode WS is electrically connected to the source line S (or formed integrally with the source line S). The source electrode WS and the drain electrode WD are in contact with the semiconductor layer SC through contact holes CH1 and CH2, respectively, made through the second insulating film 12 and the third insulating film 13. The thin film transistor Tr is covered by a fourth insulating film 14. The fourth insulating film 14 is provided also on the third insulating film 13. The fourth insulating film 14 is formed of, for example, an organic material such as a transparent resin.

The reflective layer 4 is formed on, for example, the fourth insulating film 14. The reflective layer 4 is formed of a metallic material having a high reflectivity, such as aluminum or silver. It is desirable that the surface of the reflective layer 4, which is the surface on the counter substrate CT side, be irregular with projections and recesses to impart light scattering properties.

The pixel electrode PE is formed on the fourth insulating film 14, but in the illustrated example, it is overlaid on the reflective layer 4. Note that it suffices if the reflective layer 4 is formed in a position opposing the pixel electrode PE, or another insulating film may be interposed between the pixel electrode PE and the reflective layer 4. The pixel electrode PE is in contact with the drain electrode WD of the thin film transistor Tr through a contact hole CH3 made through the fourth insulating film 14. The pixel electrode PE is formed of, for example, a transparent conductive material such as indium tin oxide (ITO) or indium zinc oxide (IZO). The pixel electrode PE is covered by the first alignment film AL1.

On the other hand, the counter substrate CT is formed from the second insulating substrate 30 having light transmissivity, such as a glass substrate or a resin substrate. The counter substrate CT comprises a light-shielding layer BM, a color filter CF, an overcoat layer OC, a common electrode CE, a second alignment film AL2 and the like, on a side of the second insulating substrate 30, which opposes the array substrate AR.

The light-shielding layer BM is formed on a side of the second insulating substrate 30, which opposes the array substrate AR. The light-shielding layer BM is formed so as to define each pixel PX by partition and also to oppose the wirings including gate lines G, source lines S and also thin film transistors Tr, provided on the array substrate AR, and contact hole CH3, etc. The light-shielding layer BM is formed of a metal material having light-shielding properties or a black resin material.

The color filter CF is formed on a side of the second insulating substrate 30, which opposes the array substrate AR and a part thereof overlaps the light-shielding layer BM as well. The color filter CF is formed of resin materials colored in a plurality of different colors, for example, red, blue and green. A red color filter is displaced to correspond to a red pixel, a green color filter is displaced to correspond to a green pixel and a blue color filter is displaced to correspond to a blue pixel. Note that the color filter CF may further include a white or transparent color filter. Each border between color filters CF of different colors is located in the position overlapping with the light-shielding layer BM.

The overcoat layer OC configured to cover color filter CF.

The overcoat layer OC is formed of a transparent resin material.

The common electrode CE is formed on a side of the overcoat layer OC, which opposes the array substrate AR. The common electrode CE is formed of, for example, a transparent conductive material such as ITO or IZO. The common electrode CE is covered by the second alignment film AL2.

In the array substrate AR and the counter substrate CT prepared as above, the first alignment film AL1 and the second alignment film AL2 are arranged to oppose each other. Here, between the array substrate AR and the counter substrate CT, a predetermined cell gap is created by a spacer (not shown). The array substrate AR and the counter substrate CT are fixed together by a sealant in the state where the cell gap is present. The liquid crystal layer LQ is sealed between the first alignment film AL1 and the second alignment film AL2. On an external surface 30B of the second insulating substrate 30, an optical device OD including a polarizing plate PL is disposed. The optical device OD is situated on a display surface side.

Figure 4:
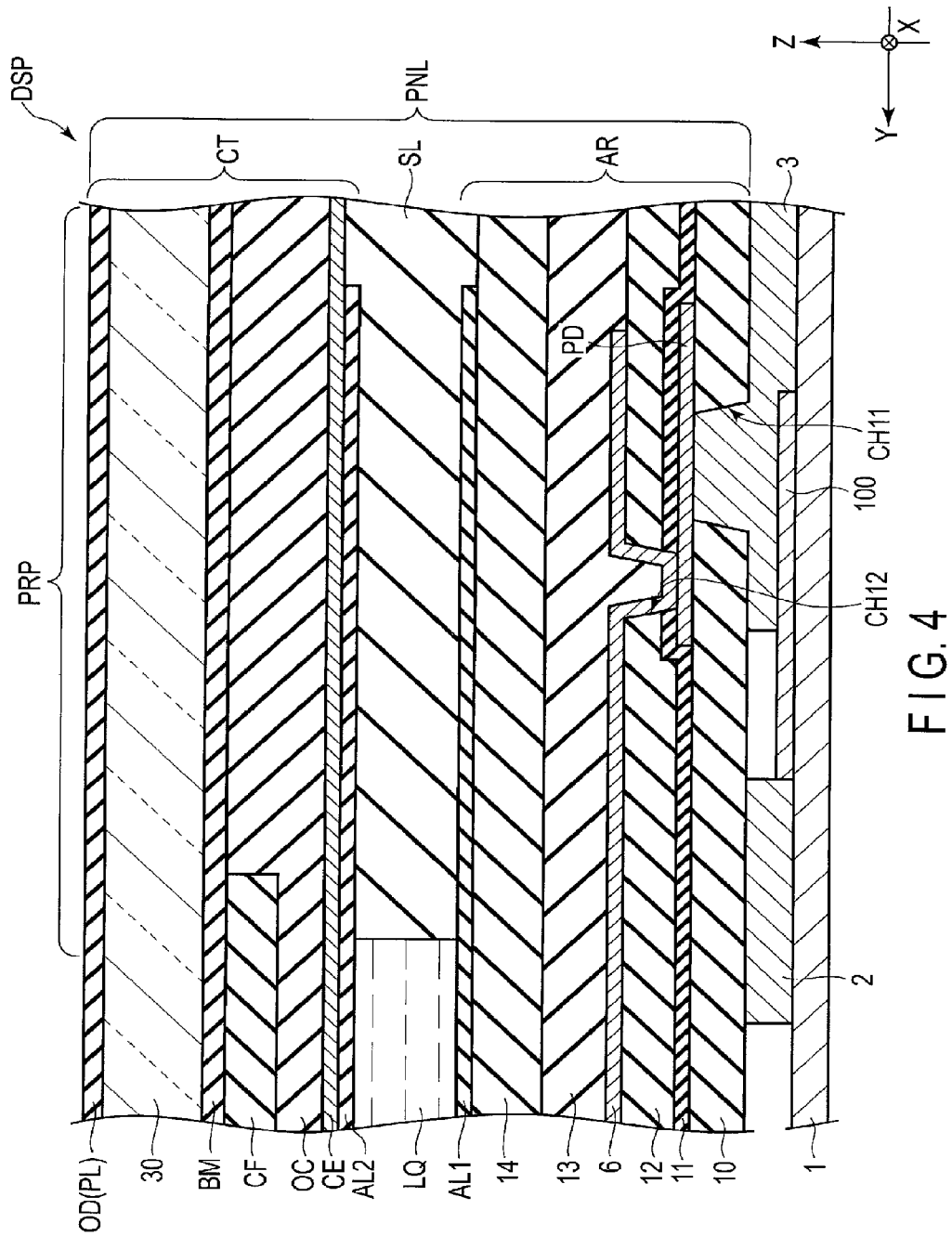
FIG. 4 is a sectional view of the display device DSP shown in FIG. 1 including its frame area PRP.

FIG. 4 is a sectional view of the display device DSP shown in FIG. 1 including its frame area PRP. Note that the counter substrate CT here has substantially the same structure as the counter substrate CT shown in FIG. 3 and therefore an explanation of its detailed structure will be omitted.

The liquid crystal display panel PNL comprises a liquid crystal layer LQ formed in a region surrounded by the sealant SL as the array substrate AR and the counter substrate CT are fixed together by the sealant SL with the cell gap created therein. The sealant SL is formed in the frame area PRP.

The pad electrode PD is formed in an island manner on the first insulating substrate 10. The first insulating substrate 10 includes contact hole CH11 made through to the pad electrode PD. In other words, the pad electrode PD is formed in a position overlapping the contact hole CH11. The pad electrode PD is formed from, for example, ITO or a metal material. The contact hole CH11 is formed in positions overlapping the sealant SL in a planer view with respect to an X-Y plane. Note that in this embodiment, the contact hole CH11 is equivalent to pierced portion made through the first insulating substrate 10 to the pad electrode PD. Further, in this embodiment, the planer view is defined as viewing towards the counter substrate CT from the array substrate AR.

The first insulating film 11 is configured to cover the pad electrode PD and the first insulating substrate 10. The second insulating film 12 is configured to cover the first insulating film 11. The contact hole CH12 made through to the respective pad electrodes PD is formed in the first insulating film 11 and the second insulating film 12. Signal line 6 is formed on, for example, the second insulating film 12 and is in contact with the pad electrode PD through the contact hole CH12. The signal line 6 is equivalent to gate lines G and source lines S shown in FIG. 2, power lines, control-use various wiring lines, etc. The third insulating film 13 is configured to cover the signal line 6 and the second insulating film 12. The fourth insulating film 14 is configured to cover the third insulating film 13.

The wiring board 1 comprises a driver 2. The driver 2 is located, for example, between the liquid crystal display panel PNL and the wiring board 1. The driver 2 functions as a signal supply source configured to supply signals necessary to drive the liquid crystal display panel PNL. Further, the wiring board 1 comprises an interconnecting wiring 100 on a side thereof, which opposes the liquid crystal display panel PNL. The interconnecting wiring 100 is electrically connected to the driver 2.

The liquid crystal display panel PNL and the wiring board 1 are fixed together by an anisotropic conductive film 3 while electrically connected to each other through the anisotropic conductive film 3, which is a conductive material. That is, the anisotropic conductive film 3 contains conductive particles (conductive particles CP described later) distributed in the adhesives. Thus, the liquid crystal display panel PNL and the wiring board 1 are electrically and mechanically connected to each other by pressurizing these along the third direction Z from the upper and lower sides and heating while the anisotropic conductive film 3 is interposed therebetween. The anisotropic conductive film 3 is formed to fill inside the contact hole CH11 from a bottom surface of the first insulating substrate 10 between the liquid crystal display panel PNL and the wiring board 1, to be in contact with the pad electrode PD. The anisotropic conductive film 3 is electrically connected to the pad electrode PD and the interconnecting wiring 100. With this structure, the interconnecting wiring 100 is electrically connected with the pad electrode PD and the signal line 6 through the anisotropic conductive film 3. Note that the interconnecting wiring 100 is formed into a plate shape parallel to the array substrate AR in the position which opposes the contact hole CH11.

Figure 7:
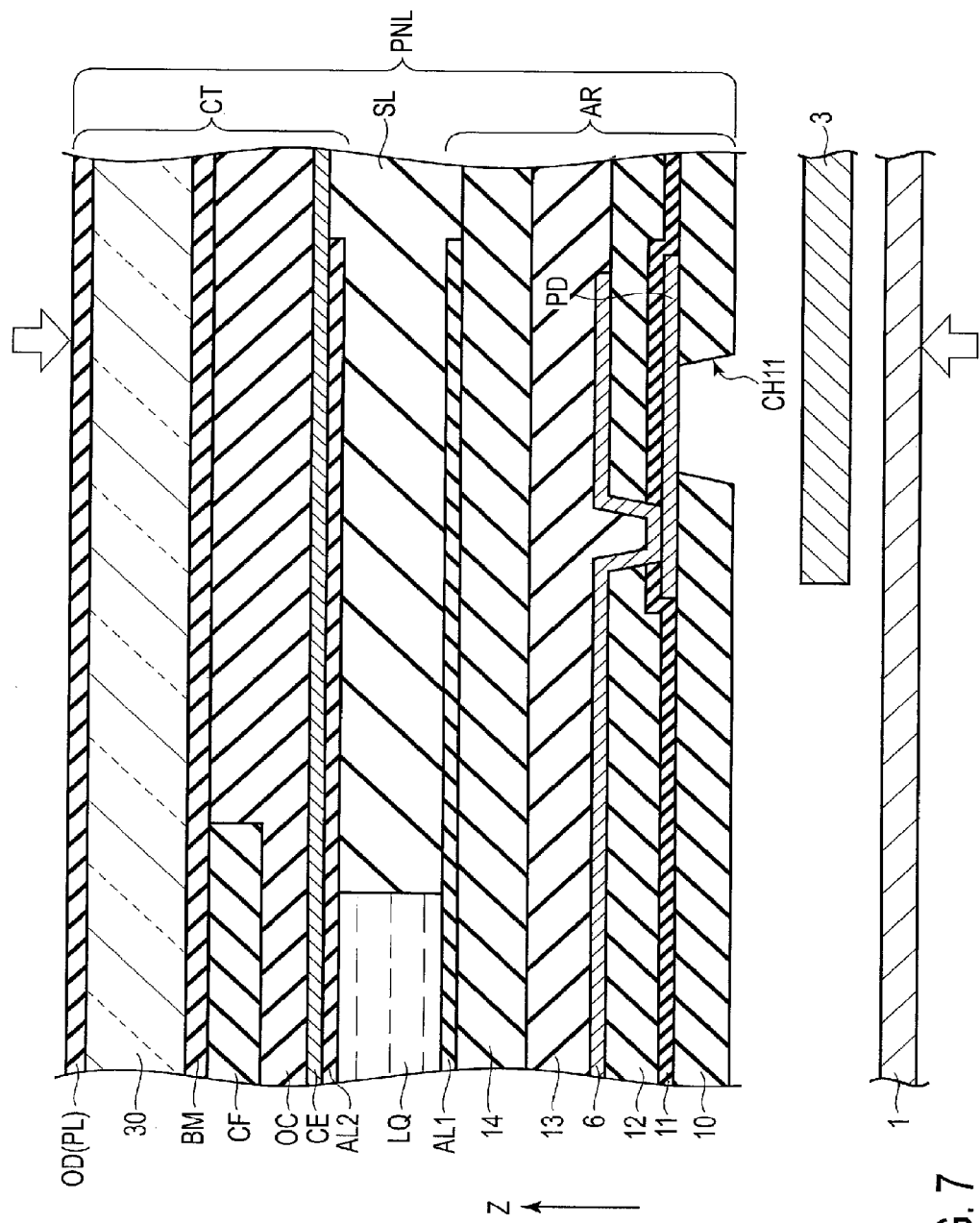
FIG. 7 is a schematic sectional view for illustrating the third step, which follows the second step of FIG. 6, of contact-bonding a wiring board 1 to a liquid crystal display panel.

Next, the process of manufacturing the display device DSP of this embodiment will now be described with reference to FIGS. 5 to 7. FIGS. 5 to 7 are each a schematic sectional view illustrating a method of contact-bonding the wiring board 1 to the liquid crystal display panel PNL in this embodiment. The structure of the layers from and above the pad electrode PD, shown in FIGS. 5 to 7 is the same as that of the liquid crystal display panel PNL shown in FIG. 4.

FIG. 5 is a schematic sectional view illustrating the first step of fixing the array substrate AR formed on a support substrate 5 and the counter substrate CT.

First, the first insulating substrate 10 is formed by forming an organic insulating film on the support substrate 5 such as a glass substrate. Then, the pad electrode PD, the first insulating film 11, the second insulating film 12, the signal line 6, the third insulating film 13, the fourth insulating film 14, the first alignment film AL1 and the like are formed consecutively to form the array substrate AR. On the other hand, the counter substrate CT is formed.

Next, the sealant SL is formed on the array substrate AR or the counter substrate CT and a liquid crystal material is dropped in a section surrounded by the sealant SL. Then, the array substrate AR and the counter substrate CT are mutually fixed. After that, the support substrate 5 is detached from the first insulating substrate 10 by irradiating with laser from the rear side of the support substrate 5.

FIG. 6 is a schematic sectional view illustrating the second step, which follows the first step in FIG. 5, of forming the contact hole CH11 in the array substrate AR.

After the detachment of the support substrate 5 from the first insulating substrate 10, the step of forming the contact hole CH11 in the array substrate AR is carried out. More specifically, the contact hole CH11 made through to the respective pad electrode PD are formed in the first insulating substrate 10 by irradiating a laser beam from the lower side of the array substrate AR towards the region which overlaps the sealant SL. In this embodiment, it is desirable to use, for example, a laser beam having a wavelength band of 258 nm or less.

FIG. 7 is a schematic sectional view illustrating the third step, which follows the second step in FIG. 6, of contact-bonding the wiring board 1 to the liquid crystal display panel PNL.

After the formation of the contact hole CH11 in the first insulating substrate 10, the step of contact-bonding the wiring board 1 to the liquid crystal display panel PNL is carried out using the anisotropic conductive film 3. That is, the anisotropic conductive film 3 is disposed between the wiring board 1 and the liquid crystal display panel PNL so as to overlap the contact hole CH11, and the resultant is heated while pressure is being applied from the lower side of the wiring board 1 and the upper side of the liquid crystal display panel PNL in the directions indicated by the arrows shown in FIG. 7. Thus, the anisotropic conductive film 3 fuses to permeate in the contact hole CH11, and therefore conductive particles contained in the anisotropic conductive film 3 are brought into contact with the pad electrode PD, thereby electrically connecting the wiring board 1 and the liquid crystal display panel PNL to each other.

By the above-described process, the wiring board 1 is contact-bonded to the liquid crystal display panel PNL.

According to the display device DSP of this embodiment, the wiring board 1 is disposed under the liquid crystal display panel PNL, which is a rear side opposite to the display surface, and they are electrically connected to each other by a conductive material (the anisotropic conductive film 3 in the above-described example) via the contact hole CH11 made through the first insulating substrate 10 of the array substrate AR. Further, the driver 2 is disposed under the liquid crystal display panel PNL. With this arrangement, it is not necessary to expand the area of the mounting portion of the array substrate AR in order to place the driver 2 and the wiring board 1, thus enabling to form the array substrate AR and the counter substrate CT to have substantially equal areas. Furthermore, it also becomes possible to expand the active area ACT in a region where the array substrate AR and counter substrate CT oppose each other. In other words, in the display surface of the display device DSP of this embodiment, the ratio of the area which contributes to the active area ACT desirably increases, making it possible to narrow the frame portion.

Moreover, a long-scale flexible printed circuit substrate to electrically connect the side of the array substrate AR, which opposes the counter substrate CT and the wiring board 1 to each other is not required, and a space for accommodating the bent flexible printed circuit substrate is also not required. Because of this, the display device DSP can be downsized. Accordingly, the electronic device incorporating the display device DSP can be downsized.

In addition, breaks in the wiring, which may occur when a flexible printed circuit substrate is bent to be accommodated can be prevented, thereby improving the reliability of the display device DSP.

Further, the contact hole CH11 is formed in a position which opposes the sealant SL. Since the sealant SL contains solid materials such as fibers, the mechanical strength of the frame area PRP mediated by the sealant SL can be improved as compared to the active area ACT, against the force applied to the liquid crystal display panel PNL in the third direction Z. That is, it is possible to inhibit damage of the liquid crystal display panel PNL, which may be caused by the force applied to the liquid crystal display panel PNL along the third direction Z during the contact-bonding of the wiring board 1 to the liquid crystal display panel PNL.

Next, a modified example of this embodiment will be described.

FIG. 8 is a schematic sectional view showing the modified example of the display device DSP according to this embodiment. The example shown in FIG. 8 uses an organic electroluminescence (EL) display device as the display device.

First, the structure of a display element portion 120 of the display device will be described. Note that the same structural elements as those of the example structure described above will be designated by the same reference symbols, and detailed explanations therefor will be omitted.

An array substrate AR comprises switching elements SW1 to SW3, organic EL devices OLED1 to OLED3, and the like, on an inner surface 10A side of a first insulating substrate 10. The switching elements SW1 to SW3 are formed on a first insulating film 11. A reflective layer 4 is formed on a fourth insulating film 14.

The organic EL devices OLED1 to OLED3 are formed on the fourth insulating film 14. In the example shown in the figure, the organic EL device OLED1 is electrically connected to the switching element SW1, the organic EL device OLED2 is electrically connected to the switching element SW2 and the organic EL device OLED3 is electrically connected to the switching element SW3. The organic EL devices OLED1 to OLED3 are all configured as a top emission type which emits white light toward the counter substrate CT side. The organic EL devices OLED1 to OLED3 are all of the same structure.

The organic EL device OLED1 comprises a positive electrode PE1 formed on the reflective layer 4. The positive electrode PE1 is in contact with a drain electrode WD of the switching element SW1, and is electrically connected to the switching element SW1. Similarly, the organic EL device OLED2 comprises a positive electrode PE2 electrically connected to the switching element SW2, and the organic EL device OLED3 comprises a positive electrode PE3 electrically connected to the switching element SW3.

The organic EL elements OLED1 to OLED3 further comprises an organic light emission layer ORG and a common electrode (negative electrode) CE. The organic light emission layers ORG are located on the positive electrodes PE1 to PE3, respectively. The common electrode CE is located on the respective organic light emission layer ORG. In the illustrated example, the organic EL devices OLED1 to OLED3 are divided into compartments by ribs 15, respectively. Note that the organic EL devices OLED1 to OLED3 should desirably be sealed with a transparent sealing film, though not illustrated.

The display element portion 120 is a display region corresponding to a region of the array substrate AR, in which a plurality of switching elements and organic EL devices OLED are arranged, so as to substantially display images.

The counter substrate CT comprises a color filter layer 220 and the like on an inner surface 30A side of the second insulating substrate 30. The color filter layer 220 comprises a color filter CF1, a color filter CF2 and a color filter CF3. The color filter CF1 is a blue color filter which opposes with the organic EL device OLED1 and passes a light component of a blue wavelength of white light. The color filter CF2 is a green color filter which opposes the organic EL element OLED2 and passes a light component of a green wavelength of white light. The color filter CF3 is a red color filter which opposes the organic EL element OLED3 and passes a light component of a red wavelength of white light.

The display element portion 120 of the array substrate AR and the counter substrate CT are fixed together with a transparent adhesive 41.

In the display device, when each of the organic EL elements OLED1 to OLED3 emits light, each of the radiated light (white light) is emitted to the outside via the color filter CF1, color filter CF2 and color filter CF3, respectively. At this time, a light component of a blue wavelength of the white light radiated from the organic EL element OLED1, passes through the color filter CF1. A light component of a green wavelength of the white light radiated from the organic EL element OLED2, passes through the color filter CF2. A light component of a red wavelength of the white light radiated from the organic EL element OLED3, passes through the color filter CF3. Thereby, color display is realized.

Next, the structure of the display device in the frame area PRP will be described.

The array substrate AR comprises the first insulating substrate 10, a pad electrode PD, a signal line 6 and the like. The first insulating substrate 10 includes a contact hole CH21 made through therein to the pad electrode PD. The signal line 6 is electrically connected to the pad electrode PD via a contact hole CH22. The wiring board 1 is located in the rear side of the array substrate AR and is electrically connected to the pad electrode PD via the anisotropic conductive film 3.

Such an organic EL display device as described above as a modified example of the display device exhibits an effect similar to that described above.

Next, a practical example of the display device according to this embodiment will be described.

Figure 9:
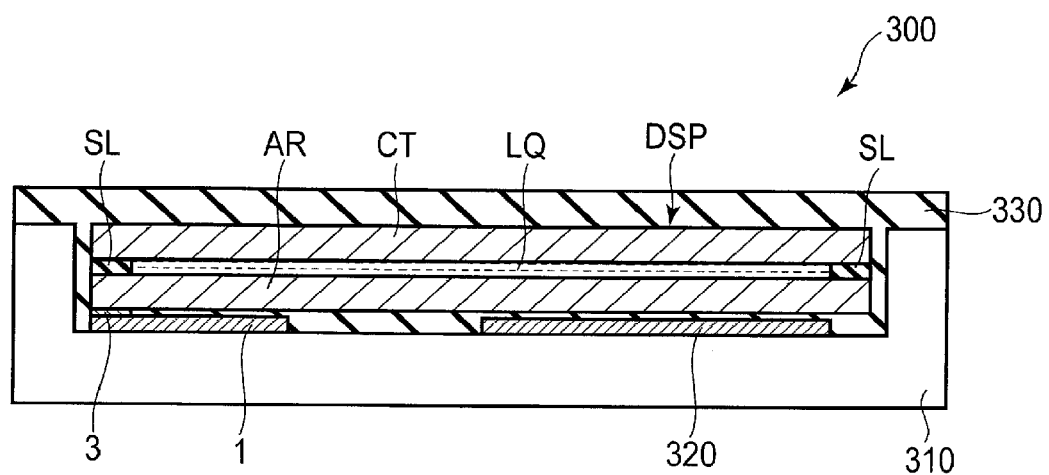
FIG. 9 is a schematic sectional view showing a card device 300, which is a practical example of the display device DSP according to this embodiment.

FIG. 9 is a schematic sectional view showing a card device 300, which is a practical example of the display device DSP according to this embodiment.

The card device 300 comprises a base 310 which accommodates the above-described display device DSP, various kinds of incorporated parts 320 such as a battery and control circuits, a sealing resin 330, and the like. The base 310 is formed into a box shape to enclose side surfaces of the display device DSP. The incorporated parts 320 are accommodated between the base 310 and the display device DSP. The sealing resin 330 is applied to fill between the base 310 and the display device DSP, the incorporated parts 320, etc., and to cover the surface of the display device DSP.

In the card device 300 described above, the width of the frame around the display device DSP can be decreased, and also the side surfaces of the display device DSP can be protected with the base 310.

Figure 10:
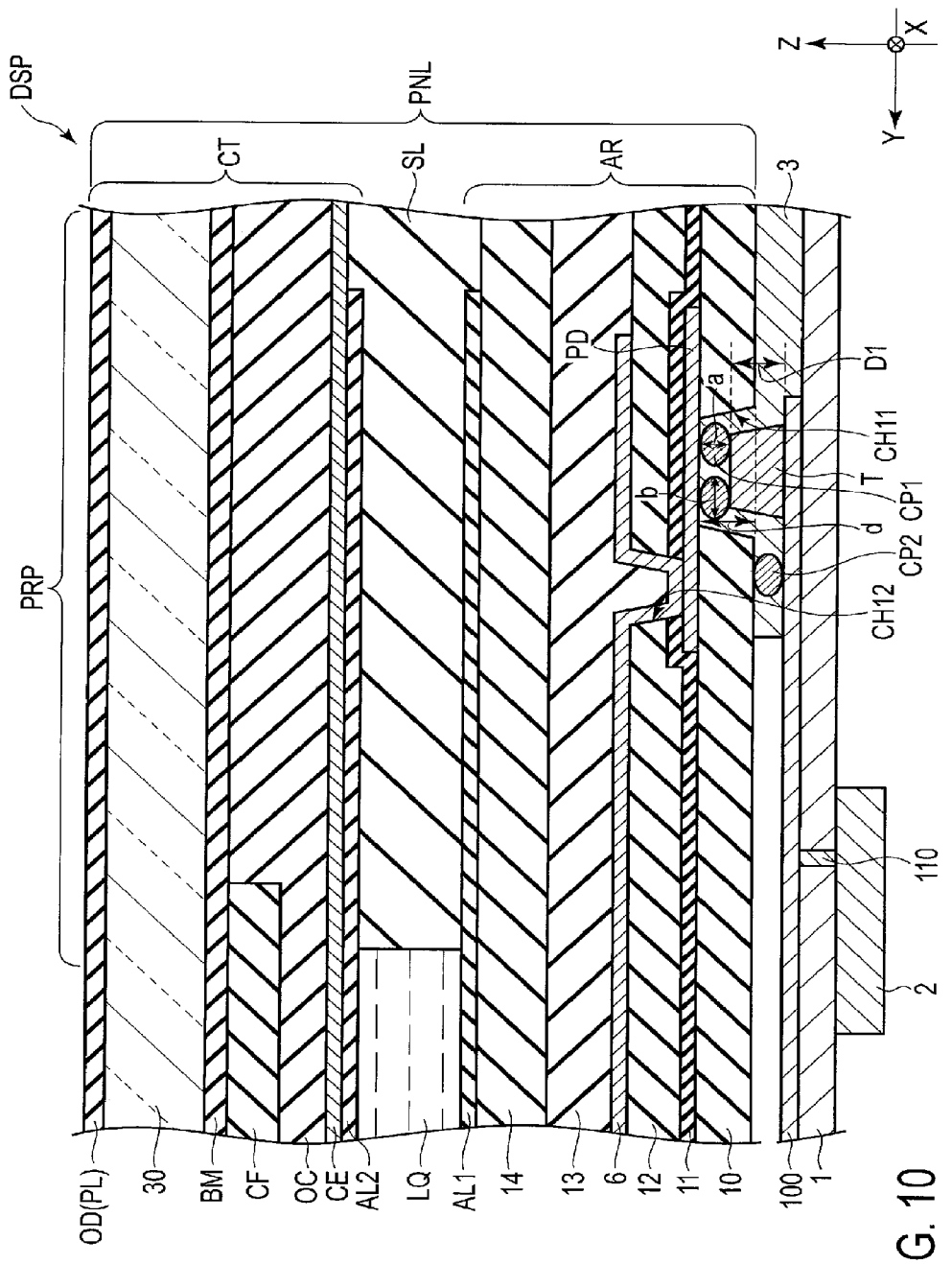
FIG. 10 is a schematic sectional view showing a modified example of the display device DSP according to this embodiment.

FIG. 10 is a schematic sectional view showing modified example of the display device DSP according to this embodiment.

The structure of the display device DSP shown in FIG. 10 is different from that of FIG. 4 in that the interconnecting wiring 100 includes a projection T. Further, a driver 2 is provided on a surface of the wiring board 1, which is opposite to the surface opposing the liquid crystal display panel PNL. The driver 2 is electrically connected to the interconnecting wiring 100 via a through-hole 110 made in the wiring board 1. Note that the position of the driver 2 is not particularly limited, but may be on a side opposing the liquid crystal display panel PNL as in the example shown in FIG. 4.

The projection T of the interconnecting wiring 100, is formed in the position which, in a planer view, overlaps the contact hole CH11. The projection T is, at least partially, provided in the contact hole CH11. The projection T is formed on the interconnecting wiring 100 using a technique such as plating. The anisotropic conductive film 3 is in contact with the pad electrode PD and the projection T. A conductive particle CP1 contained in the anisotropic conductive film 3 is interposed between the pad electrode PD and the projection T in the contact hole CH11. In the illustrated example, a conductive particle CP2 contained in the anisotropic conductive film 3 is interposed between the first insulating substrate 10 and the interconnecting wiring 100 outside the contact hole CH11. The conductive particles CP1 and CP2 each may be entirely of a metal or a resin material coated with a metal material such as nickel or gold. The projection T has a height D1 along the third direction Z. Further, the contact hole CH11 has a depth d along the third direction Z. Here, the height D1 of the projection T is greater than the depth d of the contact hole CH11. More desirably, the projection T should be formed to have the height D1 1.2 times or more but no more than two times the depth d of the contact hole CH11.

The projection T opposes the anisotropic conductive film 3 and the sealant SL along the third direction Z. Here, Young's modulus is used as a measure of the strength of the material. The conductive particle CP1 of the anisotropic conductive film 3 has a Young's modulus A, the projection T has a Young's modulus B, and the sealant SL has a Young's modulus C. The Young's modulus B of the projection T is greater than the Young's modulus A of the conductive particles CP1 and less than the Young's modulus C of the sealant SL. In other words, when the sealant SL, the projection T and the conductive particles CP1 are compared with each other in strength, the strength of the sealant SL is the greatest, that of the projection T is less than that of the sealant SL, and that of the conductive particles CP1 is the least. With this structure, when contact-bonding the wiring board 1 to the liquid crystal display panel PNL, the conductive particle CP1 is crushed by the pressure from the projection T into such a form that a length b of the side along the X-Y plane is greater than a length a along up-and-down directions along the third direction Z. But the sealant SL is not easily deformed by the pressure from the projection T and the conductive particle CP1. That is, it is possible to inhibit breakage of the liquid crystal display panel PNL, and also at the same time, to easily deform the conductive particle CP1 to follow the form of the projection T.

In this embodiment, because of the relationship between the height D1 of the projection T and the depth d of the contact hole CH11 described above, when the wiring board 1 is contact-bonded to the liquid crystal display panel PNL, the conductive particle CP1 is crushed between the projection T and the pad electrode PD, enabling to electrically connect these to each other. More specifically, since the height D1 is greater than depth d, the conductive particle CP1 between the projection T and the pad electrode PD is crushed before the conductive particle CP2 is nipped between the interconnecting wiring 100 and the first insulating substrate 10. Thus, the interconnecting wiring 100 and the pad electrode PD are electrically connected reliably. Note that it suffices if the electric conductive particles CP1 and CP2 are crushed by only about 20% of the particle diameter. In consideration of the crushing of the conductive particles, the height D1 of the projection T should desirably be 1.2 times or more of the depth d for reliable electrical connection between the interconnecting wiring 100 and the pad electrode PD.

Between the liquid crystal display panel PNL and the wiring board 1, two or more conductive particles CP never stack one on another along the third direction Z to be connected to each other. With respect to the first direction X and the second direction Y, the adhesive (insulator), which forms the anisotropic conductive film 3, enters between adjacent conductive particles CP, and thus the conductive particles CP do not substantially establish electrical continuity.

FIG. 11 is a perspective view showing the structure of a part of the interconnecting wiring 100 shown in FIG. 10.

The projection T having the height D1 is formed on the interconnecting wiring 100. The shape of the projection T, which is a truncated pyramid in the figure, is not particularly limited, but it may be a truncated cone, a hemisphere, etc. Further, the projection T can be formed into a shape which matches the contact hole CH11. When the shape of the projection T corresponds to that of the contact hole CH11, the pad electrode PD and the interconnecting wiring 100 can be electrically connected through more conductive particles CP1. Therefore, it is desirable to form the projection T into a shape as close as possible to that of the contact hole CH11. In the illustrated example, the cross section of the projection T taken along the X-Z plane defined by the first direction X and the third direction Z, and the cross section of the projection T taken along the Y-Z plane defined by the second direction Y and the third direction Z are both trapezoidal.

FIG. 12 is a diagram illustrating positions of the interconnecting wiring 100, the contact hole CH11, the pad electrode PD and the like with respect to each other in the display device DSP shown in FIG. 10.

In the illustrated example, the pad electrode PD and the contact hole CH11 are both formed into approximately rectangular shapes when taken along the X-Y plane. Along the first direction X and the second direction Y, the contact hole CH11 is formed smaller than the pad electrode PD. The signal line 6 is extended along the second direction Y and is connected to the pad electrode PD. The interconnecting wiring 100 is extended along the second direction Y and opposes the signal line 6. Along the first direction X and the second direction Y, the projection T is formed smaller than the contact hole CH11 and entirely fits into the contact hole CH11.

In the example illustrated in FIGS. 10 to 12, the projection T of the interconnecting wiring 100 can crush many more conductive particles CP1 located between the pad electrode PD and itself in the contact hole CH11. Therefore, the interconnecting wiring 100 and the pad electrode PD can be electrically connected to each other more reliably with a low pressure for attachment. Thus, it is possible to improve the yield and reliability.

Figure 13:
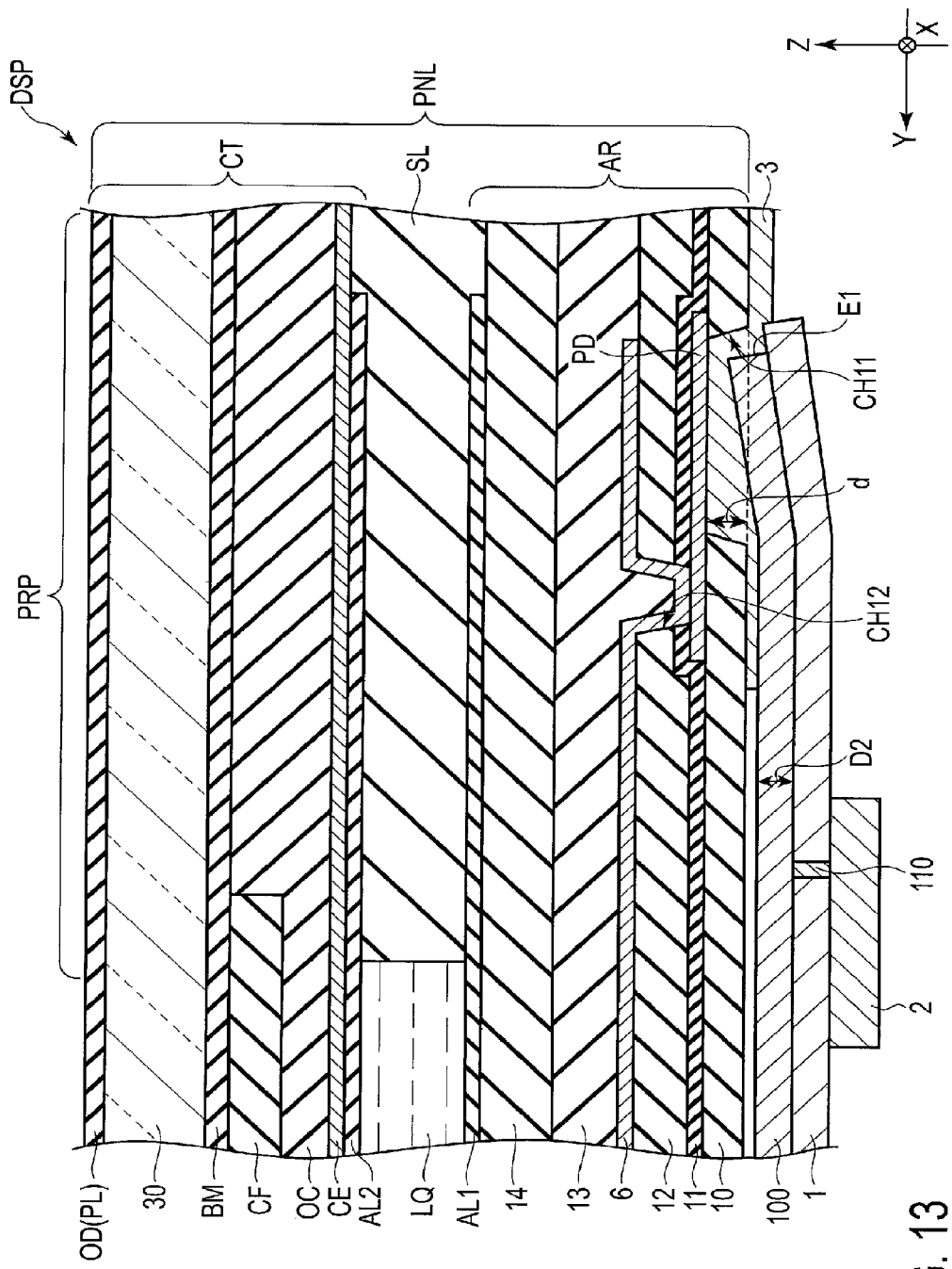
FIG. 13 is a schematic sectional view showing a modified example of the display device DSP according to this embodiment.

FIG. 13 is a schematic sectional view showing a modified example of the display device DSP according to this embodiment.

The structure of the display device DSP shown in FIG. 13 is different from that of FIG. 10 in the structure of the interconnecting wiring 100.

An interconnecting wiring 100 includes a wiring end portion E1 provided in the contact hole CH11. The interconnecting wiring 100 is formed into a convex shape as described later. The interconnecting wiring 100 shown in FIG. 10 includes the projection T at a portion thereof, whereas in the example shown in FIG. 13, the interconnecting wiring 100 itself has a height D2 along the third direction Z as a whole and the wiring end portion E1 of the interconnecting wiring 100 is bent upward along the third direction Z. Note that an anisotropic conductive film 3 containing conductive particles which are not shown in the figure, is interposed between a pad electrode PD and the wiring end portion E1 in the contact hole CH11, to electrically connect them to each other. Similar to the case described above with reference to FIG. 10, the height D2 of the wiring end portion E1 of the interconnecting wiring 100, which is located at least in the contact hole CH11 may be greater than the depth d of the contact hole CH11. More desirably, the interconnecting wiring 100 should be formed to have a height D2 1.2 times or more of the depth d of the contact hole CH11. Further, the Young's modulus of each of the interconnecting wiring 100, the sealant SL and the conductive particles is the same as that described above with reference to FIG. 10.

With the structure in which the convex interconnecting wiring 100 having the height D2 and the contact hole CH11 having the depth d are positioned with relative to each other as described above, when the wiring board 1 is contact-bonded to the liquid crystal display panel PNL, the conductive particles contained in the anisotropic conductive film 3 are crushed with the wiring board 1 and the liquid crystal display panel PNL.

FIG. 14 is a perspective view showing the structure of a part of the interconnecting wiring 100 shown in FIG. 13.

The interconnecting wiring 100 is formed into a convex shape having the height D2 along the third direction Z. In the illustrated example, the cross section of the interconnecting wiring 100 taken along the X-Z plane is trapezoidal. Note that the embodiment is described on the assumption that the cross section of the interconnecting wiring 100 is trapezoidal, but the shape is not particularly limited. The sectional shape of the interconnecting wiring 100 can be formed into various shapes according to the shape of the contact hole CH11.

FIG. 15 is a diagram illustrating positions of the interconnecting wiring 100, the contact hole CH11, the pad electrode PD and the like with respect to each other in the display device DSP shown in FIG. 13.

The wiring end portion E1 of the interconnecting wiring 100 is situated to oppose the pad electrode PD through the contact hole CH11 When taken along the X-Y plane. The width of the wiring end portion E1 along the first direction X is less than the width of the contact hole CH11 along the first direction X. The wiring end portion E1 having such a configuration is located in the contact hole CH11. In the example shown in FIGS. 13 and 15, the contact hole CH11 is formed into approximately a rectangular shape. But the shape is not limited to this, and may be formed into other shapes.

The example shown in FIGS. 13 to 15 exhibits an effect similar to that of the example of FIG. 10 and the like.

Figure 16:
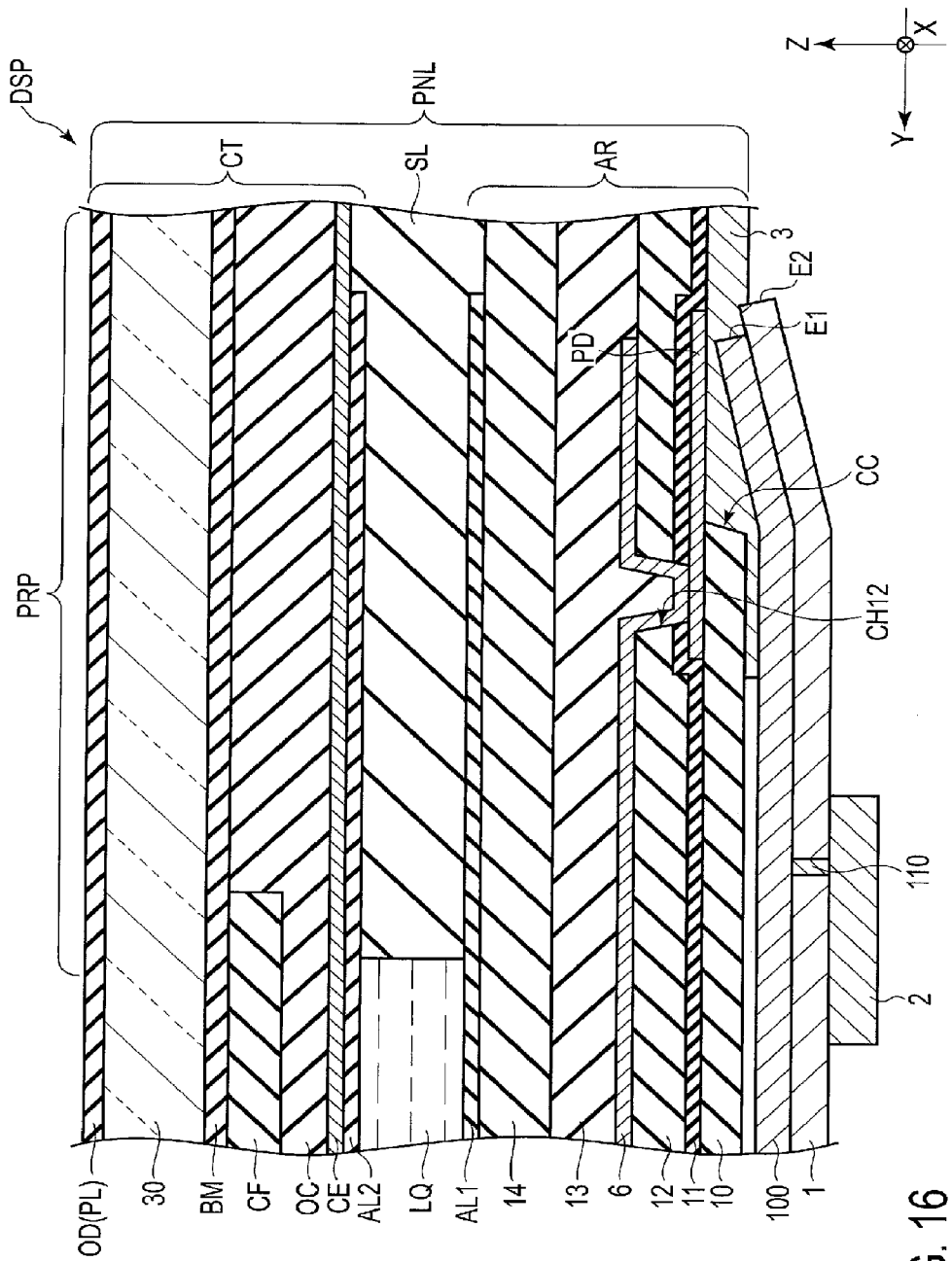
FIG. 16 is a schematic sectional view showing a modified example of a display device according to this embodiment.

FIG. 16 is a schematic sectional view showing a modified example of the display device DSP according to this embodiment.

The structure of the display device DSP shown in FIG. 16 is different from that of FIG. 13 in that the contact hole CH11 is replaced by a concave portion CC which is a pierced portion.

The concave portion CC is formed in the first insulating substrate 10 to be through to the pad electrode PD. The concave portion CC is extended further outward from the position opposing the pad electrode PD. When focusing on the positions of the concave portion CC and the wiring board 1 with respect to each other, it can be understood that the concave portion CC is extended out from the position opposing the end portion E2 of the wiring board 1. The concave portion CC may in some cases be extended to the end of the array substrate AR. The end portion E1 of the interconnecting wiring 100 is located in the concave portion CC. Note that an anisotropic conductive film 3 containing conductive particles which are not shown is interposed between the pad electrode PD and the wiring end portion E1 in the concave portion CC, so as to electrically connect these to each other. The relationship between the depth of the concave portion CC and the height of the wiring end portion E1 is the same as that described with reference to FIG. 13.

Figure 17:
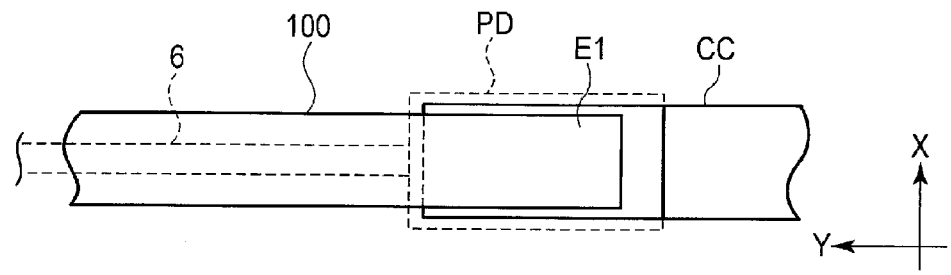
FIG. 17 is a diagram illustrating positions of the interconnecting wiring 100, the contact hole CH11, the pad electrode PD and the like with respect to each other in the display device DSP shown in FIG. 16.

FIG. 17 is a diagram illustrating positions of the interconnecting wiring 100, the concave portion CC, the pad electrode PD and the like with respect to each other in the display device DSP shown in FIG. 16.

The concave portion CC is expanded along the second direction Y when taken along the X-Y plane. In the illustrated example, the concave portion CC is extended to a side opposite to the side in which a signal line 6 of the pad electrode PD is extended.

In the contact-bonding of the wiring board 1 and the liquid crystal display panel PNL, when the anisotropic conductive film 3 is being interposed between the wiring board 1 and the liquid crystal display panel PNL, air may enter around the anisotropic conductive film 3. Further, when heated in the contact-bonding process, the air surrounding the anisotropic conductive film 3 may be thermally expanded to damage the display device DSP. According to structure as shown in FIG. 16 and FIG. 17, the concave portion CC partially opened to the outside is extended out from the wiring board 1. With this structure, when heated in the contact-bonding process, the adhesives of the anisotropic conductive film 3 melts to release the air in the concave portion CC toward the outside of the wiring board 1. Thus, in the process of contact-bonding the wiring board 1 and the liquid crystal display panel PNL to each other, air that entered the concave portion CC is not trapped therein, enabling to inhibit breakage of the display device DSP by the thermal expansion of the air during heating.

Figure 18:
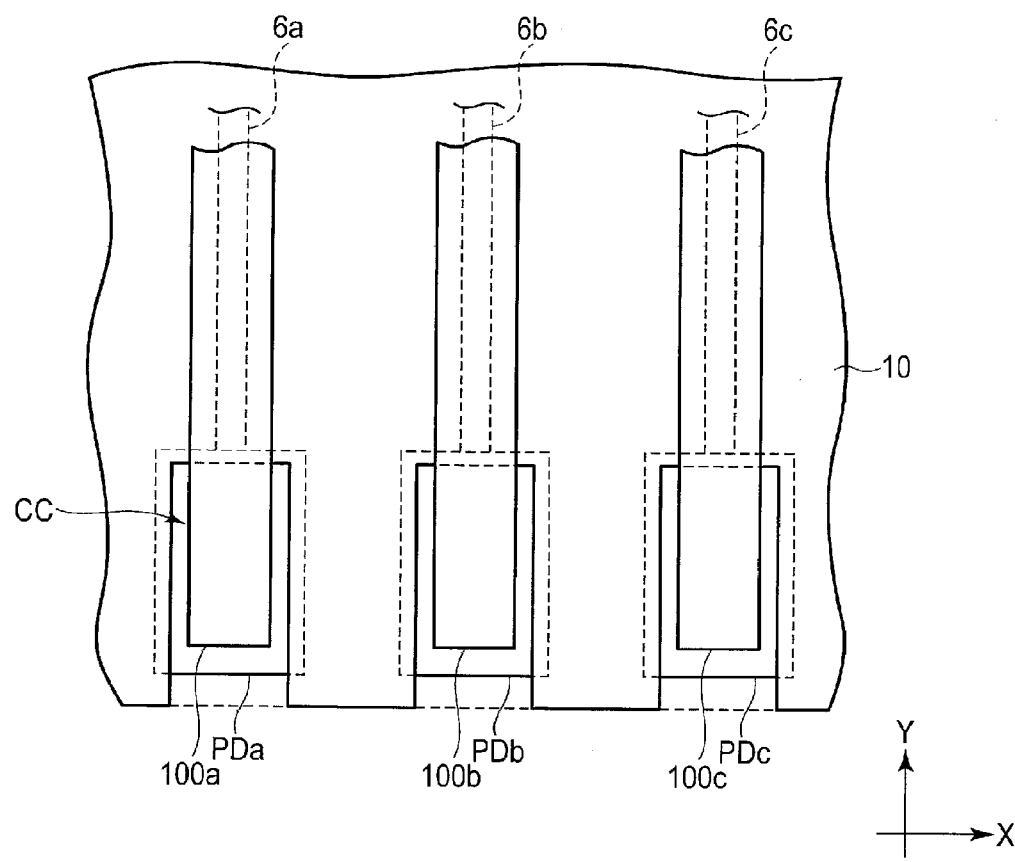
FIG. 18 is a diagram showing an example of the layout of the structure of the modified example shown in FIG. 17.

FIG. 18 is a diagram showing an example of the layout of the structure according to the modified example shown in FIG. 17. FIG. 18 shows a structure in which the structural members of the interconnecting wiring 100, the pad electrode PD and the signal line 6 shown in FIG. 17 are aligned along the first direction X.

Signal lines 6a, 6b and 6c are arranged along the first direction X in this order and are each extended along the second direction Y. Pad electrodes PDa, PDb and PDc are aligned on substantially the same column along the first direction X.

The first insulating substrate 10 is interposed between the signal lines 6a to 6c and interconnecting wirings 100a to 100c. A concave portion CC is formed so as to expose pad electrodes PDa to PDc. The interconnecting wirings 100a to 100c are extended to the concave portion CC, and oppose the pad electrodes PDa to PDc, respectively, in the X-Y plane.

With such a structure as described above, an effect similar to that of the structure shown in FIG. 16 and FIG. 17 can be obtained.

FIG. 19 is a diagram showing another example of the layout of the structure according to the modified example shown in FIG. 17. FIG. 19 shows a structure in which the structural members of the interconnecting wiring 100, the pad electrode PD and the signal line 6 shown in FIG. 17 are arranged in a staggered manner.

Signal lines 6a, 6b, 6c, 6d and 6e are arranged along the first direction X in this order and are each extended along the second direction Y. Pad electrodes PDa, PDc and PDe are aligned on substantially a same column along the first direction X. Pad electrodes PDb and PDd are aligned on substantially another same column along the first direction X. Thus, the pad electrodes PDa, PDb and PDe are formed on a column different from that of the pad electrodes PDb and PDd. The signal line 6b is disposed between the pad electrodes PDa and PDc. The signal line 6d is disposed between the pad electrodes PDc and PDe. With this arrangement of the pad electrodes PDa to PDe, the interconnecting wiring 100 and the like can be more densely arranged along the first direction X.

The first insulating substrate 10 is interposed between the signal lines 6a to 6e and the interconnecting wirings 100a to 100e. Note that the first insulating substrate 10 is interposed between the signal line 6b and the interconnecting wiring 100b in a region between the pad electrodes PDa and PDc as well, and also interposed between the signal line 6d and the interconnecting wiring 100d in a region between the pad electrodes PDc and PDe as well.

A concave portion CC is formed so as to expose all the pad electrodes PDa to PDe. The interconnecting wirings 100a to 100e are extended to the concave portion CC and oppose the pad electrodes PDa to PDe, respectively, in the X-Y plane.

The following description will be focused on three interconnecting wirings 100b, 100c and 100d aligned along the first direction X. Here, a wiring end portion of the interconnecting wiring 100b is denoted as a first wiring end portion E11, that of the interconnecting wiring 100c as a second wiring end portion E12 and that of the interconnecting wiring 100d as a third wiring end portion E13. The first wiring end portion E11 and the third wiring end portion E13 are provided on a further outer side from the second wiring end portion E12. The pad electrode PDb and the first wiring end portion E11 are electrically connected to each other by an anisotropic conductive film (not shown), and so are the pad electrode PDc and the second wiring end portion E12, and the pad electrode PDd and the third wiring end portion E13.

With such a structure as described above, an effect similar to that of the structure shown in FIG. 16 and FIG. 17 can be obtained. In addition, even if the interconnecting wirings are formed to be highly dense, it is possible to inhibit short-circuiting between the signal line 6b and the pad electrodes PDa and PDc located on both sides thereof and short-circuiting between the signal line 6d and the pad electrodes PDc and PDe on both sides thereof.

As described above, according to this embodiment, a down-sized and narrow-framed display device can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
   a display area, and a non-display area around the display area,
   a first substrate comprising a plurality of pixels formed in the display area, an insulating substrate including a pierced portion in the non-display area, a pad electrode formed on the insulating substrate in the non-display area, and a signal line electrically connected to the pad electrode and led out from the display area to the non-display area;
   a second substrate opposed to the first substrate;
   a liquid crystal layer held between the first substrate and the second substrate;
   a sealant to fix the first substrate and the second substrate together;
   a wiring board comprising an interconnecting wiring and located under the insulating substrate; and
   a conductive material provided in the pierced portion and electrically connecting the pad electrode and the interconnecting wiring to each other,
   wherein the pierced portion is formed in a position overlapping the sealant in a planar view.

2. The display device of claim 1, wherein the interconnecting wiring has a first Young's modulus, the sealant has a second Young's modulus, and the conductive material has a third Young's modulus, the first Young's modulus being greater than the third Young's modulus and less than the second Young's modulus.

3. The display device of claim 1, wherein the insulating substrate is formed from polyimide.

4. The display device of claim 1, wherein the first substrate further comprises a switching element electrically connected to the signal line, a pixel electrode electrically connected to the switching element and a reflective layer opposing the pixel electrode.

5. The display device of claim 1, wherein the interconnecting wiring is formed into a flat plate shape and the pierced portion is filled with the conductive material.

6. A display device comprising:
   a display area, and a non-display area around the display area;
   a first substrate comprising a plurality of pixels formed in the display area and an insulating substrate including a pierced portion in the non-display area, a pad electrode formed on the insulating substrate in the non-display area, and a signal line electrically connected to the pad electrode and led out from the display area to the non-display area;
   a wiring board comprising an interconnecting wiring and located under the insulating substrate; and
   a conductive material provided in the pierced portion and electrically connecting the pad electrode and the interconnecting wiring to each other,
   wherein the interconnecting wiring includes a projection provided in the pierced portion, and the conductive material is provided between the pad electrode and the projection in the pierced portion.

7. The display device of claim 6, wherein the conductive material is in contact with the pad electrode and the projection.

8. The display device of claim 6, wherein the conductive material contains conductive particle, and the conductive particle has such a form that a length of a side is greater than a length along up-and-down directions.

9. The display device of claim 6, wherein a height of the projection is greater than a depth of the pierced portion.

10. A display device comprising:
    a display area, and a non-display area around the display area;
    a first substrate comprising a plurality of pixels formed in the display area and an insulating substrate including a pierced portion in the non-display area, a pad electrode formed on the insulating substrate in the non-display area, and a signal line electrically connected to the pad electrode and led out from the display area to the non-display area;
    a wiring board comprising an interconnecting wiring and located under the insulating substrate; and
    a conductive material provided in the pierced portion and electrically connecting the pad electrode and the interconnecting wiring to each other,
    wherein the interconnecting wiring includes a wiring end portion bent upward.

11. The display device of claim 10, wherein the wiring end portion is located in the pierced portion.

12. The display device of claim 10, wherein the pierced portion is extended out from a position opposing an end portion of the wiring board.

13. The display device of claim 10, wherein the wiring end portion includes a first wiring end portion, a second wiring end portion and a third wiring end portion, and the first wiring end portion and the third wiring end portion are provided on an outer side from the second wiring end portion, the conductive material is configured to electrically connect the pad electrode and the second wiring end portion to each other, and the pierced portion is a concave shape.

* * * * *